ns Aktiengesellschaft, Berlin
United States Patent [19]

Ahne et al.

[11] 4,332,882
[45] Jun. 1, 1982

[54] METHOD FOR THE PREPARATION OF HIGHLY HEAT-RESISTANT RELIEF

[75] Inventors: Hellmut Ahne, Röttenbach; Eberhard Kühn, Hemhofen; Roland Rubner, Röttenbach, all of Fed. Rep. of Germany

[73] Assignee: Siemeand Munich, Fed. Rep. of Germany

[21] Appl. No.: 179,463

[22] Filed: Aug. 19, 1980

[30] Foreign Application Priority Data

Aug. 21, 1979 [DE] Fed. Rep. of Germany ....... 2933871

[51] Int. Cl.$^3$ ................................................ G03C 5/00
[52] U.S. Cl. ............................... 430/322; 204/159.14; 204/159.19; 430/9; 430/18; 430/270; 430/280; 430/281; 430/296
[58] Field of Search .................... 430/9, 18, 270, 280, 430/281, 296, 322, 253, 254; 204/159.14, 159.19

[56] References Cited

U.S. PATENT DOCUMENTS 3,957,512 5/1976 Kleeberg ............................. 430/311

Primary Examiner—Jack P. Brammer

Attorney, Agent, or Firm—Kenyon & Kenyon

[57] ABSTRACT

The present invention relates to a method for the preparation of highly heat-resistant relief structures by applying radiation-sensitive soluble polymer precursor stages in the form of a film or a foil to a substrate; irradiating the film or the foil through negative patterns with actinic light or by deflecting a light, electron or ion beam; removing the non-irradiated film or foil portions; and optionally, by subsequent annealing; as well as to the use of the relief structures made in this manner. It is provided for this purpose to use precursor stages of polyimidazoles and polyimidazopyrrolones in the form of addition products of olefinically unsaturated monoepoxides on amino group-containing polycondensation products of aromatic and/or heterocyclic tetraamino compounds with dicarboxylic-acid chlorides or esters, or on amino group-containing polyaddition products of the tetraamino compounds and tetracarboxylic-acid dianhydrides. The relief structures prepared by the method according to the invention are suited particularly for use as resists, surface coating material and insulating material.

7 Claims, No Drawings

METHOD FOR THE PREPARATION OF HIGHLY HEAT-RESISTANT RELIEF

BACKGROUND OF THE INVENTION

The present invention relates to a method for the preparation of highly heat-resistant relief structures by applying radiation-sensitive soluble polymer precursor stages in the form of a film or a foil to a substrate; irradiating the film or the foil through negative patterns with actinic light or by deflecting a light, electron or ion beam; removing the non-irradiated portions of the film or foil; and, optionally, subsequent annealing, as well as to the use of relief structures prepared in this manner.

A method of the type mentioned for the preparation of relief structures on the basis of polymers is known from German Patent 2 308 830 and its corresponding U.S. Pat. No. 3,957,512. According to this method, polyaddition or polycondensation products of polyfunctional carbocyclic or heterocyclic compounds, < . . >, with diamines, diisocyanates, bisacid chlorides or dicarboxylic acids < carrying radiation-sensitive radicals > are used as soluble polymer precursor stages. The compounds which carry radiation-sensitive radicals contain two carboxyl, carboxylic-acid chloride, amino, isocyanate or hydroxyl groups suitable for addition or condensation reactions and, partly, << . . . >>, radiation-reactive groups bound << in ortho- or peri-position thereto >> to carboxyl groups in ester fashion. The diamines, diisocyanates, bis-acid chlorides and dicarboxylic acids to be reacted with these compounds have at least one cyclic structure element.

The soluble polymer precursor stages are crosslinked in the irradiation and are thereby converted into insoluble intermediate products. These intermediate products are subjected to cyclization in the annealing, with highly heat-resistant polymers of the following classes of materials being formed in the process: Polyimides, polyamidimides, polyester imides, poly-1,3-quinazoline-2,6-diones, polyisoindoloquinazoline diones, poly-1,3-oxazine-6-ones and polybenz-1,3-oxazine-2,4-diones.

SUMMARY OF THE INVENTION

It is an object of the present invention to further develop the method of the type mentioned at the outset in such a manner that the supply of highly heat-resistant relief structures is increased.

According to the present invention, this and other objects are achieved by the provision that precursor stages of polyimidazoles and polyimidazopyrrolones are used in the preparation of highly heat-resistant relief structures. The polyimidazole and polyimidazopyrrolone precursors are in the form of an addition product of an olefinically unsaturated monoepoxide and either (a) an amino group-containing polycondensation product of (1) an aromatic and/or heterocyclic tetraamino compound and (2) a dicarboxylic acid chloride or ester or (b) an amino group-containing polyaddition product of (1) an aromatic and/or heterocyclic tetraamino compound and (2) a tetracarboxylic acid dianhydride.

Relief structures on the basis of polyimidazoles and polyimidazopyrrolones are not known to date. The relief structures prepared by the method according to the present invention, which are based on this principle, exhibit excellent temperature resistance. In addition, these relief structures are soluble in part in polar organic solvents such as dimethylsulfoxide, dimethylacetamide, dimethylformamide and N-methylpyrrolidone and can, therefore, also be removed again from substrates if necessary. The method according to the present invention is furthermore distinguished by the fact that the polymer precursor stages are soluble in part in aqueous-alkaline media, i.e., such that the radiation-reactive precursor stages can be developed after exposure by aqueous-alkaline chemicals. This is of interest particularly for economic and ecological reasons, since the disadvantages of organic developers such as flammability and toxicity are eliminated.

In the method according to the present invention, the polymer precursor stages can be used advantageously together with light- or radiation-sensitive copolymerizable compounds. N-substituted maleinimides are preferably used for this purpose. However, acrylate or methacrylate group-containing compounds may also be used. Furthermore, customary photo initiators and/or sensitizers can also be used (see: "Industrie Chimique Belge", 24, 1959, pages 739 to 764, as well as J. Kosar, "Light-Sensitive Systems", John Wiley & Sons Inc., New York 1965, pages 143 to 146 and pages 160 to 188). Particularly well suited additives are Michler's ketone and/or benzoine ether, 2-tert-butyl-9,10-anthraquinone, 1,2-benz-9,10-anthraquinone and 4,4'-bis(diethylamino)-benzophenone. In addition, adhesion agents can be used with the method according to the invention. For this purpose serve in particular silanes such as vinyltriethoxy silane, vinyl-tris($\beta$-methoxy-ethoxy) silane, $\gamma$-methacryloxypropyl-trimethoxy silane and $\gamma$-glycidoxypropyl-trimethoxy silane.

The radiation-reactive precursor stages which are used with the method according to the present invention and are of oligomeric and/or polymeric nature, are described in the concurrently-filed U.S. patent application entitled "Polyimidazole And Polyimidazopyrrolone Precursor Stages And The Preparation Thereof", Ser. No. 179,455, filed Aug. 19, 1980. These precursor stages have generally the following structure:

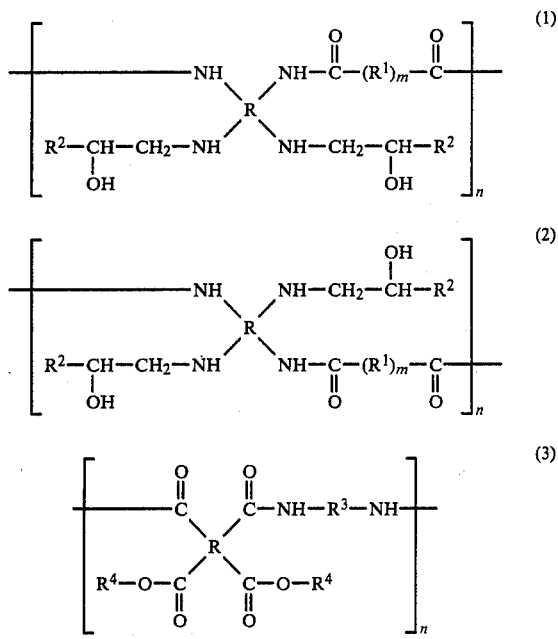

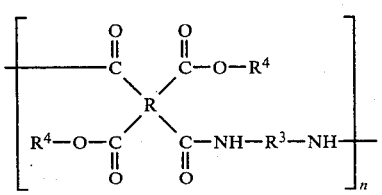

In Formulas (1) to (4), n means an integral number from 2 to about 100, and m is 0 or 1. Formulas (1) and (2) show polyimidazole precursor stages, and Formulas (3) and (4) show polyimidazopyrrolone precursor stages.

The following applies to R, $R^1$, $R^2$, $R^3$ and $R^4$:

R is an optionally halogenated, at least partially aromatic and/or heterocyclic tetravalent, i.e., tetrafunctional, radical, in which two valences always are arranged adjacent to each other; if the radical R has several aromatic and/or heterocyclic structure elements, then the valence pairs are located at respective end-position structure elements of this type;

$R^1$ is an optionally halogenated divalent, i.e., difunctional, radical with an aliphatic and/or cycloaliphatic structure, optionally having hetero atoms, and/or aromatic and/or heterocyclic structure;

$R^2$ in an olefinically unsaturated radical, for example, an allyl-ether-containing group, particularly an optionally substituted (meth) acryl-ester-containing group;

$R^3$ is an at least partially aromatic and/or heterocyclic divalent, i.e., difunctional, radical, in which an amino group is arranged adjacent to at least one of the valences; if $R^3$ has several aromatic and/or heterocyclic structure elements, then the free valences are located at end-position structure elements of this kind;

$R^4$ is hydrogen or a hydroxyalkyl radical substituted with $R^2$.

Preferred are addition products of glycidyl acrylate or glycidyl methacrylate on the polycondensation product of diaminobenzidine and isophthalic-acid dimethylester and addition products of glydicyl acrylate or glycidyl methacrylate on the polyaddition product of diamino benzidine and pyromellithic-acid dianhydride. Examples of such polymer precursor stages are shown in the following formulas (5) and (6):

the polymer precursor stage is applied to a substrate in the form of a film or a foil and is exposed through a mask with actinic light or is irradiated by deflection of a light, electron or ion beam; subsequently, the non-exposed or non-irradiated film or foil portions are dissolved or stripped off and the relief structures so obtained are optionally annealed. The precursor stage can advantageously be applied to the substrate dissolved in an organic solvent, N-methylpyrrolidone preferably being used as the solvent. The concentration of the solution can be adjusted so that with known coating methods such as centrifuging, immersion, spraying, brushing or rolling-on, layer thicknesses from 0.01 μm to several hundred μm can be produced. It has been found, for example, that with coating by centrifuging, 300 to 10,000 RPM for 1 to 100 seconds are suitable to obtain a uniform and high surface quality. The photo resist layer applied to the substrate, which consists preferably of glass, metal, plastic or semiconductor material, can be freed of the solvent at room temperature or at elevated temperature, preferably at a temperature of about 50° to 60° C. in a nitrogen or air stream. This process may also be performed in a vacuum.

To obtain a sufficient difference in the solubility between the irradiated and the non-irradiated film or foil portions, exposure times between 20 and 800 seconds are sufficient, depending upon the composition and the layer thickness, with the method according to the invention, using a 500-W very high-pressure mercury lamp. After exposure, the non-exposed parts of the film or the foil are dissolved out, preferably in aqueous-alkaline media or also with an organic developer.

By means of the method according to the present invention, images with sharp contours, i.e., relief structures, are obtained which are converted by annealing into highly heat-resistant polymers which are resistant to acids and alkaline solutions. In general, temperatures of from about 220° to 500° C. can be chosen for the annealing preferably temperatures of about 300° to 400° C. The annealing time is generally half an hour, and no discoloration is to be observed in nitrogen. The edge sharpness and the dimensional accuracy of the relief structures are practically unimpaired by the annealing. In addition, the high surface quality of the relief structures is preserved despite the loss of layer thickness which occurs in the annealing.

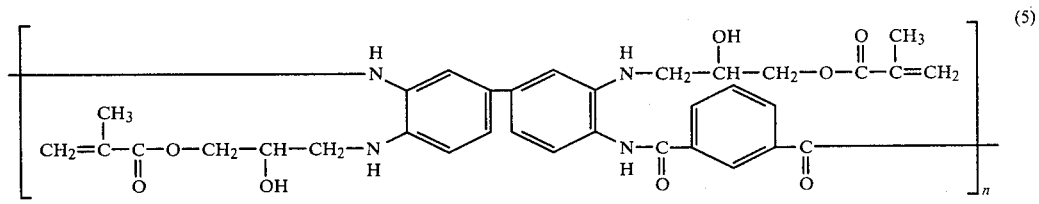

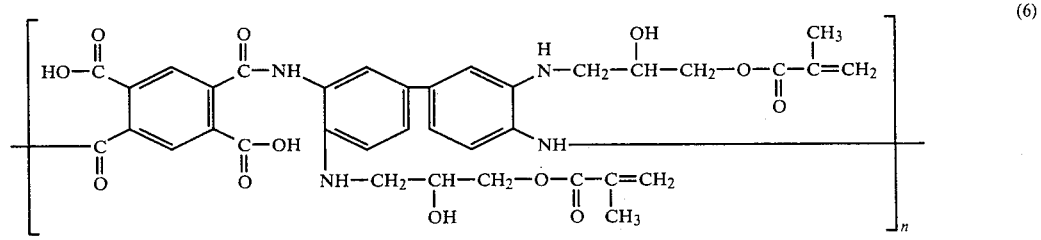

Formula (5) shows a polyimidazole precursor stage, and Formula (6) a polyimidazopyrrolone precursor stage.

The relief structures according to the present invention are prepared, as earlier noted, in such a manner that In the method according to the present invention, polymer precursor stages of aromatic components preferably are used, so that polymers with the following structural units are formed in the thermal treatment (i.e., in the annealing):

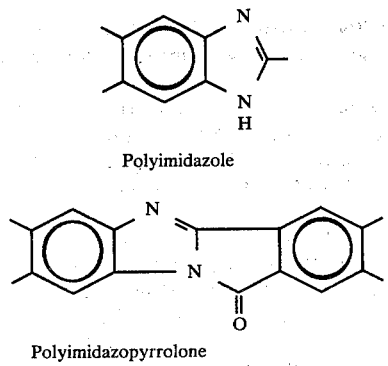

Polyimidazole (7)

Polyimidazopyrrolone (8)

The mentioned classes of compounds are among the semiladder polymers or ladder polymers, respectively, and are distinguished by high temperature resistance (up to about 500° C.).

The relief structures according to the present invention can be used for the preparation of passivation coatings on semiconductor components, thin- and thick-film circuits, solder protection layers on multilayer circuits, insulating layers as a component of multilayer circuits and miniaturized insulating layers on electrically conducting and/or semiconducting and/or insulating base material, particularly in the field of microelectronics, or generally for fine-structuring of substrates. The highly heat-resistant relief structures preferably serve as masks for wet- and dry-etching processes, electroless or electrolytic metal deposition and vapor deposition methods, as well as masks for ion implanation, and, in addition, as insulating and protective layers in electrotechnology. Relief structures of the polyimidazole type can be used to advantage if the relief structure is to provide an intermediary protective function, since these relief structures are soluble in polar solvents and can, therefore, be removed again easily. The relief structures prepared in accordance with the present invention can further be used to advantage as orientation layers, for example, in liquid-crystal displays, as well as for rastering surfaces, for example, in x-ray screens, particularly in x-ray image amplifiers.

DETAILED DESCRIPTION OF THE INVENTION

The invention is explained in still further detail with the aid of the following, non-limiting embodiment examples

EXAMPLE I

Preparation of a Radiation-Reactive Polybenzimidazole Precursor Stage 10.4 parts by weight 3,3'-diaminobenzidine are dissolved in 25 parts by volume N-methylpyrrolidone and heated together with 9.7 parts by weight isophthalic-acid dimethylester for 8 hours to a temperature of 150° to 175° C. and subsequently for 2 days to about 185° C. 20 parts by volume glycidyl methacrylate are added to this solution. This mixture is held for 48 hours at room temperature and subsequently for 4 hours at a temperature of about 50° to 60° C.

Preparation of the Relief Structure

To 14 parts by volume of the solution of the polybenzimidazole precursor stage prepared in the manner described above, 0.2 parts by weight N-phenylmaleinimide and 0.04 parts by weight Michler's ketone are added. The solution so obtained is centrifuged at 1000 RPM on an aluminum foil to form a film 10 μm thick. After drying for 2 hours at about 60° C. in a vacuum, a contact exposure through a mask is performed for 3 minutes with a 500-W very-high-pressure mercury lamp. Thereupon, the development is performed for 10 to 15 seconds with a mixture of ethanol and N-methylpyrrolidone in a volume ratio of 9:1, structures of 80 to 100 μm being obtained. After annealing for 1 hour at about 370° C., a layer thickness of 4 to 5 μm is obtained. No impairment of the quality of the relief structure due to the anneal is observed.

EXAMPLE II

Preparation of a Radiation-Reactive Polyimidazopyrrolone Precursor Stage

In a reaction flask flushed with nitrogen, a solution of 21.4 parts by weight (0.1 mol) diaminobenzidine in 190 parts by volume dimethylacetamide is received. To this solution are quickly added, first, while stirring vigorously, 190 parts by volume of a solution of 21.8 parts by weight pyromellithic-acid dianhydride (0.1 mol) in 195 parts by volume dimethyl acetamide. The prepolymer solution obtained is stirred slowly for about 30 minutes while it is allowed to cool down to room temperature. Thereupon, the remaining pyromellithic-acid dianhydride solution is added dropwise. After this solution is added completely, the straw-yellowish prepolymer solution becomes slightly viscous. It is important in this connection that pure starting materials and solvents are used.

To 44 parts by volume of the prepolymer solution obtained in the manner described above, 15 parts by weight glycidyl methacrylate (0.1 mol) are added dropwise at room temperature while stirring. After about 30 minutes, the reaction solution is heated for 12 hours to about 50° to 60° C., cooled down to room temperature and left standing for 48 hours. Subsequently, the solution is added dropwise, stirring vigorously, to 1000 parts by volume isopropanol. In the process, a yellow-brown substance is precipitated, which is dried in a vacuum.

Preparation of the Relief Structure 10 parts by weight of the polyimidazopyrrolone precursor stage prepared in the manner described above, 0.5 parts by weight N-phenylmaleinimide and 0.3 parts by weight Michler's ketone are dissolved in 50 parts by volume of a mixture of dimethylacetamide and dioxane (volume ratio 1:1). The solution is centrifuged at 1000 RPM on an aluminum foil to form a film. After drying for one hour at about 60° C. in a vacuum (film thickness: 3.3 μm), a contact exposure is made through a negative mask for 4 minutes with a 500-W very-high-pressure mercury lamp; subsequently, development is performed for 45 seconds with a 1-% sodium phosphate solution. Relief structures with sharp contours and a resolution of better than 10 μm are obtained which are not impaired by a 45 minute anneal at about 400° C. The final layer thickness is 1.6 μm.

The relief structures according to the invention are preferably suitable for application as a resist with intermediate protective function for lithographic structuring of surfaces, particularly for the dry etching process, or for permanent coating or screening of surfaces, or as a protective or insulating material for electrical engineering purposes.

What is claimed is:

1. In a method for the preparation of highly heat-resistant relief structures wherein radiation-sensitive soluble polymer precursor stages are applied in the form of a film or a foil on a substrate; the film or the foil is irradiated through negative patterns with actinic light or by deflecting a light, electron or ion beam; and the non-irradiated film or foil portions removed, the improvement comprising utilizing a precursor stage comprising a member selected from a polyimidazole and a polyimidazopyrrolone precursor in the form of an addition product of an olefinically unsaturated monoepoxide and a product selected from (a) an amino group-containing polycondensation product of an aromatic and/or heterocyclic tetraamino compound with a member selected from the group consisting of a dicarboxylic-acid chloride and a dicarboxylic acid ester and (b) an amino group-containing polyaddition product of said tetraamino compound and a tetracarboxylic-acid dianhydride.

2. The method according to claim 1 wherein said polymer precursor stage is utilized together with a light- or radiation-sensitive copolymerizable compound.

3. The method according to claim 2 wherein said copolymerizable compound comprises N-substituted maleinimide.

4. The method according to claim 1 wherein said precursor stage comprises an addition product of glycidyl acrylate or -methacrylate on the polycondensation product of diaminobenzidine and isophthalic-acid dimethylester.

5. The method according to claim 1 wherein said precursor stage comprises an addition product of glycidyl acrylate or -methacrylate on the polyaddition product of diaminobenzidine and pyromellithic-acid dianhydride.

6. The method according to claim 1 wherein said foil or film having non-irradiated portions removed therefrom is subsequently annealed.

7. A highly heat-resistant relief structure prepared according to the method of claim 1.

* * * * *